United States Patent
Lu et al.

(10) Patent No.: US 12,362,238 B2
(45) Date of Patent: Jul. 15, 2025

(54) METAL GATE PROCESS AND RELATED STRUCTURE

(71) Applicant: Taiwan Semiconductor Manufacturing Company, Ltd., Hsinchu (TW)

(72) Inventors: Chih-Lun Lu, New Taipei (TW); Jih-Sheng Yang, Hsinchu (TW); Chen-Wei Pan, Hsinchu County (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 437 days.

(21) Appl. No.: 17/804,146

(22) Filed: May 26, 2022

(65) Prior Publication Data
US 2023/0386920 A1 Nov. 30, 2023

(51) Int. Cl.
H01L 21/768 (2006.01)
H01L 23/535 (2006.01)
H10D 30/62 (2025.01)
H10D 64/01 (2025.01)

(52) U.S. Cl.
CPC .. H01L 21/76897 (2013.01); H01L 21/76805 (2013.01); H01L 21/76826 (2013.01); H01L 21/76895 (2013.01); H01L 23/535 (2013.01); H10D 30/6219 (2025.01); H10D 64/01 (2025.01)

(58) Field of Classification Search
CPC ............. H01L 29/401; H01L 21/76895; H01L 23/535; H01L 21/76834; H01L 29/41791; H01L 21/76897; H01L 21/76826; H01L 21/76805; H01L 29/66795; H01L 21/0334; H01L 27/0886; H01L 29/0649; H01L 29/6653; H01L 21/823431; H01L 23/53295; H01L 29/6656; H01L 29/66545; H01L 29/785; H01L 21/762; H01L 29/42376; H01L 29/4232; H01L 29/4966; H01L 29/517; H01L 21/28114; H01L 21/32134; H01L 29/4958; H01L 29/7851; H01L 21/28088; H01L 21/31111; H01L 21/28132
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |

(Continued)

Primary Examiner — Mouloucoulaye Inoussa
(74) Attorney, Agent, or Firm — Haynes and Boone, LLP

(57) ABSTRACT

A method of forming a semiconductor device includes providing a device having a gate stack with a metal gate layer and a spacer layer disposed on a sidewall of the gate stack. In some embodiments, the method further includes performing an etch-back process to the metal gate layer to form an opening over the gate stack. In various examples, the method further includes performing a plasma treatment process to modify a profile of the opening. In some cases, the method further includes forming a HM layer over the metal gate layer and within the opening having the modified profile.

20 Claims, 10 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2012/0088359 A1* | 4/2012 | Kim .................. H01L 29/66545 |
| | | 257/E21.409 |
| 2014/0374805 A1* | 12/2014 | Wu .................... H01L 21/76895 |
| | | 257/288 |
| 2015/0118835 A1* | 4/2015 | Lin ................... H01L 29/66477 |
| | | 438/586 |
| 2015/0123175 A1* | 5/2015 | Lin ....................... H01L 29/402 |
| | | 257/288 |
| 2016/0343827 A1* | 11/2016 | Wu ........................... H01L 29/78 |
| 2017/0243869 A1* | 8/2017 | Chang ................... H01L 29/517 |
| 2017/0271469 A1* | 9/2017 | Huang .............. H01L 29/66545 |
| 2018/0040715 A1* | 2/2018 | Chang ................ H01L 29/7851 |
| 2019/0051730 A1* | 2/2019 | Min .................... H01L 21/0334 |
| 2020/0083351 A1* | 3/2020 | Lim .................. H01L 21/28026 |
| 2020/0343362 A1* | 10/2020 | Wu ..................... H01L 29/4966 |
| 2020/0368498 A1* | 11/2020 | Vaillancourt ......... A61M 25/02 |
| 2021/0119034 A1* | 4/2021 | Lian ................ H01L 21/823821 |
| 2021/0233997 A1* | 7/2021 | Chen ................. H01L 21/31116 |
| 2021/0249271 A1* | 8/2021 | Peng ..................... H01L 29/785 |
| 2021/0327760 A1* | 10/2021 | Ho ........................ H01L 21/022 |
| 2021/0335613 A1* | 10/2021 | Chiang ............. H01L 21/32134 |
| 2021/0391455 A1* | 12/2021 | Lin ................... H01L 29/66795 |
| 2022/0102199 A1* | 3/2022 | Hsiung ............. H01L 21/76897 |
| 2022/0102202 A1* | 3/2022 | Hsiung ............. H01L 21/76826 |
| 2022/0157653 A1* | 5/2022 | Liao ................. H01L 21/76897 |
| 2022/0189776 A1* | 6/2022 | Chiang ............. H01L 21/28088 |
| 2022/0293742 A1* | 9/2022 | Tsai .................... H01L 29/7851 |
| 2022/0344486 A1* | 10/2022 | Chang ............. H01L 21/823475 |

* cited by examiner

METAL GATE PROCESS AND RELATED STRUCTURE

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, even with the introduction of FinFETs, aggressive scaling down of IC dimensions has resulted in increased leakage current and/or shorting between a FinFET gate and FinFET source/drain regions or source/drain contacts, among other issues, that have resulted in degradation of device performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
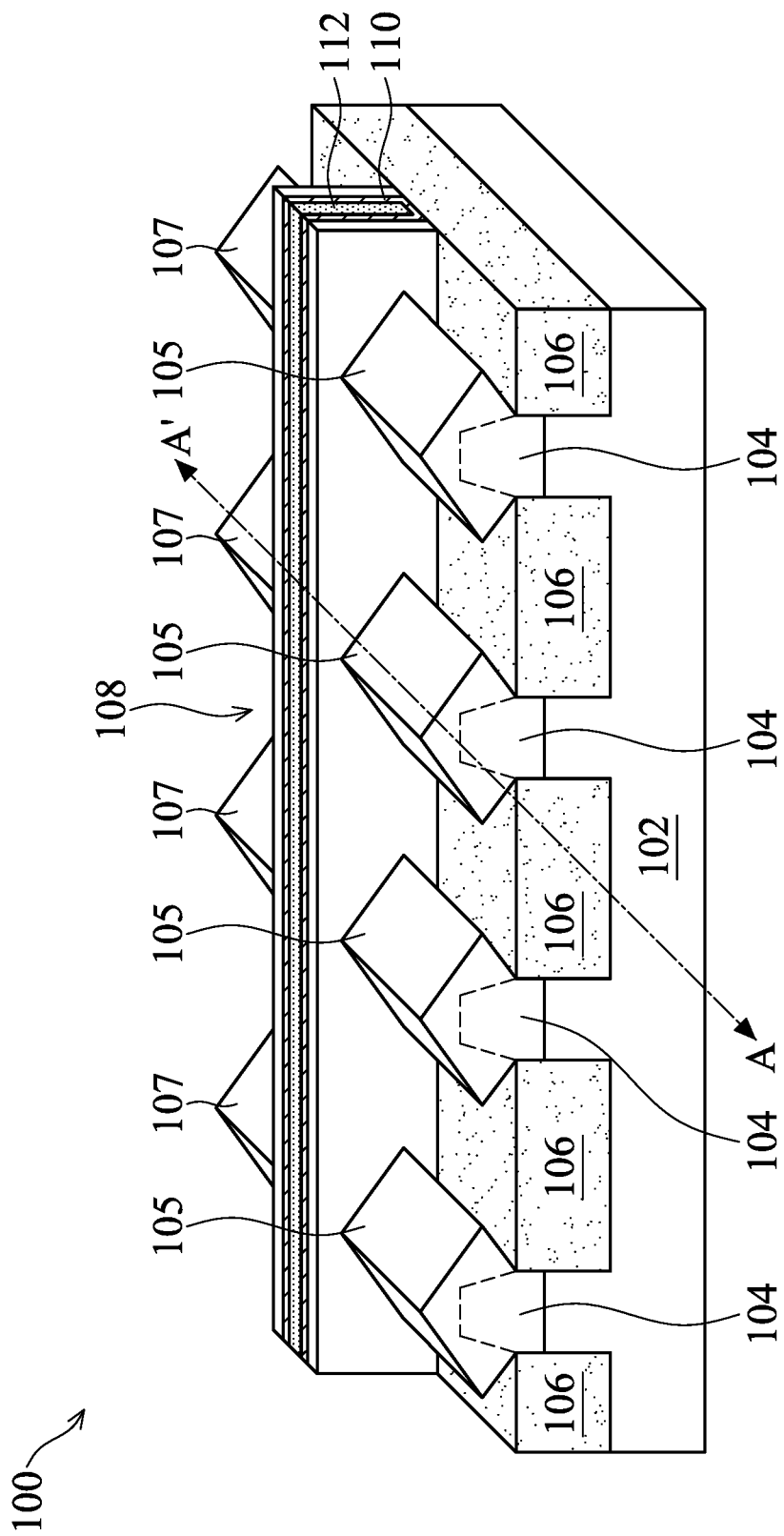
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

It is also noted that the present disclosure presents embodiments in the form of multi-gate transistors or fin-type multi-gate transistors referred to herein as FinFET devices. Such a device may include a P-type FinFET device or an N-type FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include an SOI structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch, a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section AA' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 $cm^2$/V-s and a hole mobility of around 480 $cm^2$/V-s, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation regions 106 include STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack including a gate dielectric layer 110, and a metal layer 112 formed over the gate dielectric layer. In some embodiments, the gate dielectric layer 110 may include an interfacial layer formed over the channel region of the fin 104 and a high-K dielectric layer over the interfacial layer. The interfacial layer of the gate dielectric layer 110 may include a dielectric material such as silicon oxide layer ($SiO_2$) or silicon oxynitride (SiON). The high-K dielectric layer of the gate dielectric layer 110 may include $HfO_2$, $TiO_2$, $HfZrO$, $Ta_2O_3$, $HfSiO_4$, $ZrO_2$, $ZrSiO_2$, combinations thereof, or other suitable materials. In still other embodiments, the gate dielectric layer 110 may include silicon dioxide or another suitable dielectric. The gate dielectric layer 110 may be formed by chemical oxidation, thermal oxidation, atomic layer deposition (ALD), physical vapor deposition (PVD), chemical vapor deposition (CVD), and/or other suitable methods. The metal layer 112 may include a conductive layer such as W, TiN, TaN, WN, Re, Ir, Ru, Mo, Al, Cu, Co, Ni, combinations thereof, and/or other suitable compositions. In some embodiments, the metal layer 112 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 112 may provide a gate electrode for the FinFET device 100, including both N-type and P-type FinFET devices 100. In some embodiments, the metal layer 112 may alternately include a polysilicon layer. The metal layer 112 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

As noted above, aggressive scaling down of IC dimensions has resulted in increased leakage current and/or shorting between a FinFET gate and FinFET source/drain regions or source/drain contacts, among other issues, that have degraded device performance. For example, in an effort to avoid metal bridging between a transistor source/drain and a gate, a self-aligned contact (SAC) fabrication method has been introduced. The SAC fabrication method, in general, provides a hardmask (HM) layer over a transistor gate so that an adjacent source/drain contact opening can be directly etched without the use of photolithography (e.g., a self-aligned process). A metal layer is subsequently deposited within the source/drain contact opening to provide an electrical connection to the source/drain region of the transistor. The profile of the SAC HM layer is a key factor for both the landing accuracy of the source/drain contact metal and the process window available to avoid an electrical short between the FinFET gate (or metal gate via) and the source/drain contact. However, in at least some conventional SAC fabrication methods, it is quite challenging to precisely land the source/drain contact metal on the source/drain region of the transistor without shorting to the metal gate via. Such challenges are due at least in part to the limited etching window for the source/drain contact metal and due to the fact that there are limited methods to control the profile for the source/drain contact metal. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for modifying the SAC HM layer profile to provide precise landing of the source/drain contact metal on the source/drain region of the transistor while also preventing shorting to the metal gate via, thereby enhancing device performance. In some examples, and after a metal gate etch-back process, a plasma treatment may be performed to modify the profile of an opening over the transistor gate within which the SAC HM layer will be formed. In some embodiments, the plasma treatment includes a fluorine plasma treatment, although other etch chemistries may be used, as described herein. As a result of the plasma treatment process, the subsequently formed SAC HM layer will have a larger width in a top region of the SAC HM layer and a smaller width in a bottom region of the SAC HM layer. By providing the modified SAC HM layer profile, the etching window for the source/drain contact metal may be improved, which provides for the precise landing of the source/drain contact metal on the source/drain region of the transistor and an improved/more precise profile of the source/drain contact metal, while any possible shorting between the metal gate via and the source/drain contact metal can be prevented, thus enhancing device performance. Additional embodiments and advantages are discussed below and/or will be evident to those skilled in the art in possession of this disclosure.

Figure 2:
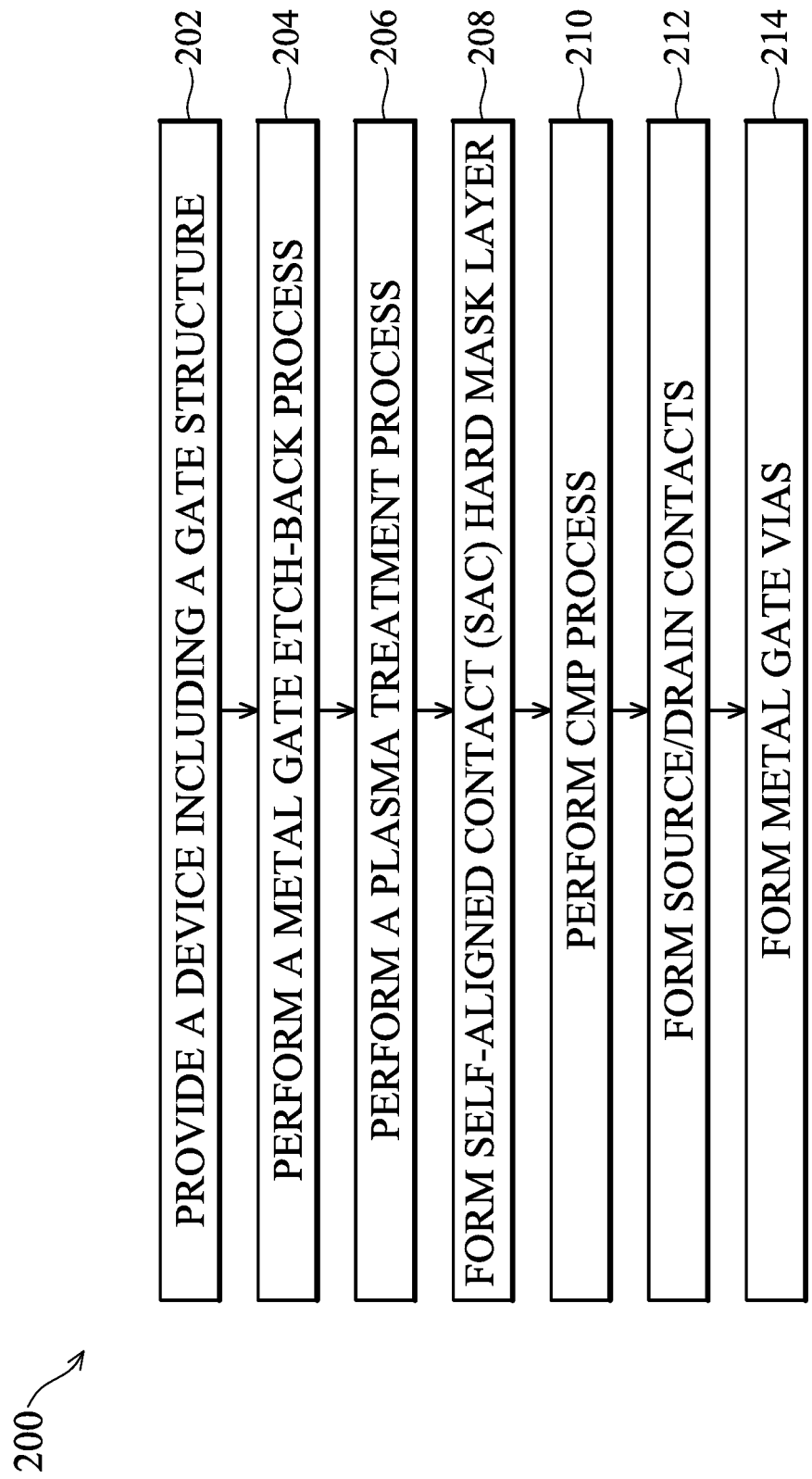
FIG. 2 is a flow chart of a method of fabricating a semiconductor device, in accordance with some embodiments.

Referring now to FIG. 2, illustrated is a method 200 of fabricating a semiconductor device (e.g., such as a FinFET device) including a modified SAC HM layer profile, for example as part of a SAC process flow, in accordance with one or more embodiments. In some embodiments, the method 200 may be used to fabricate the device 100, described above with reference to FIG. 1. Thus, one or more aspects discussed above with reference to the device 100 may also apply to the method 200. Additionally, FIGS. 3-8 provide cross-sectional views, along a plane substantially parallel to a plane defined by section AA' of FIG. 1, of an exemplary device 300 fabricated according to one or more steps of the method 200 of FIG. 2.

It is understood that parts of the method 200 and/or semiconductor device 300 may be fabricated by a well-known CMOS technology process flow, and thus some processes are only briefly described herein. In addition, as described above, the device 300 may share aspects of the device 100, thus some aspects and/or processes of the device 300 are only discussed briefly for purposes of clarity in understanding. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

In various embodiments, the device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), high voltage transistors, high frequency transistors, other memory cells, and/or combinations thereof.

Figure 3:
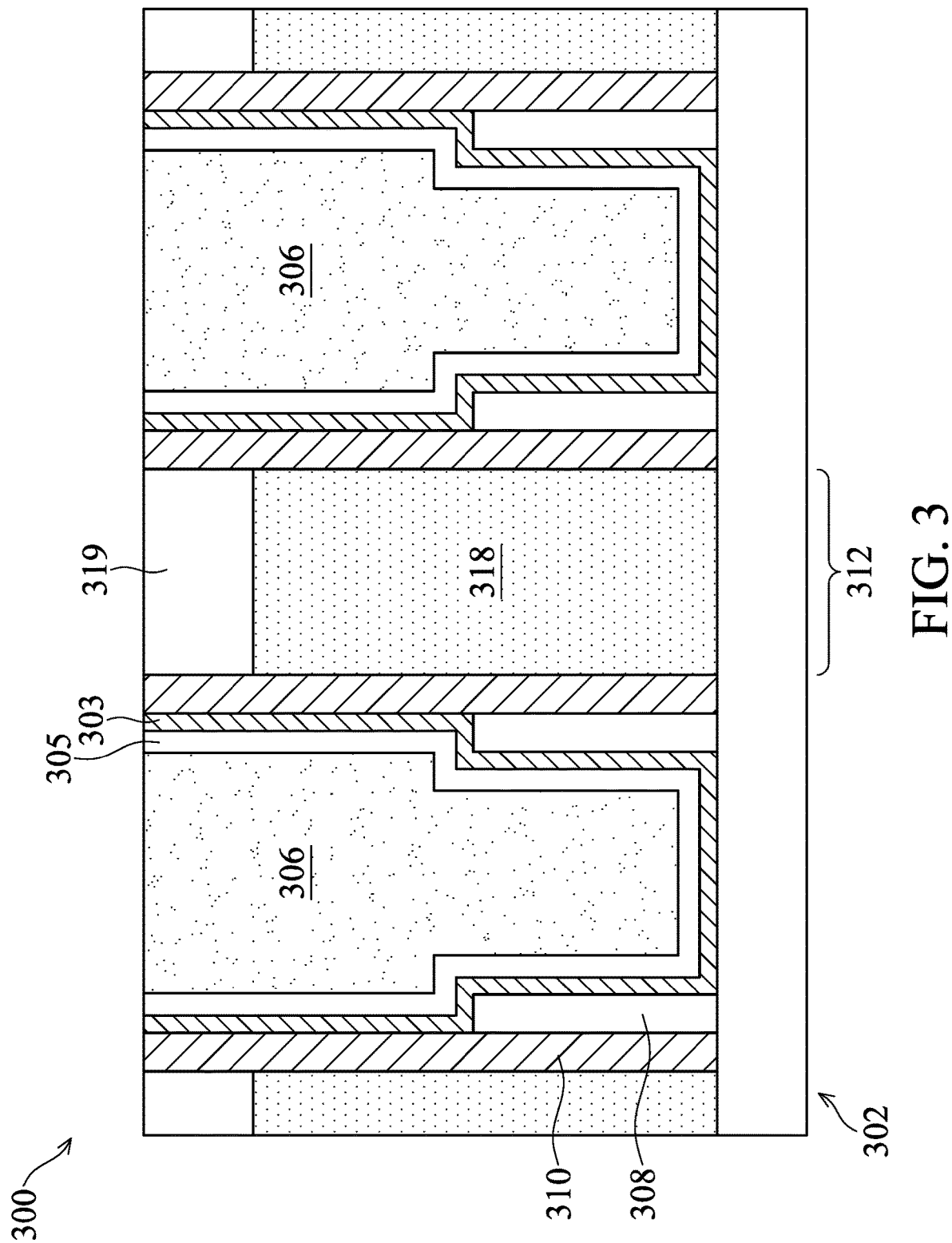
FIGS. 3, 4, 5, 6, 7, and 8 provide cross-sectional views, along a plane substantially parallel to a plane defined by section AA' of FIG. 1, of an exemplary device fabricated according to one or more steps of the method of FIG. 2.

Referring now to the method 200, the method 200 begins at block 202 where a device including a gate structure is provided. Referring to FIG. 3, and in an embodiment of block 202, illustrated therein is a device 300 including a fin 302 that extends from a substrate, a gate stack including a gate dielectric layer composed of an interfacial layer 303 and a high-K dielectric layer 305 over the interfacial layer 303, and a metal layer 306 over the high-K dielectric layer 305. In some embodiments, the substrate, the fin 302, the gate dielectric layer including the interfacial layer 303 and the high-K dielectric layer 305, and the metal layer 306 may be substantially similar to the substrate 102, the fin elements 104, the gate dielectric layer 110 (which includes an interfacial layer and high-K dielectric layer), and the metal layer 112 discussed above with reference to FIG. 1. The device 300 also includes a plurality of sidewall spacer layers 308, 310 formed on sidewalls of the gate stack. In some embodiments, the spacer layers 308, 310 may include a dielectric material such as silicon oxide, SiN, SiC, SiON, SiOC, SiOCN, SiCN, or combinations thereof.

In some embodiments, the device 300 also includes epitaxial source/drain features disposed in source/drain regions 312 on opposing sides of the gate stacks. In some embodiments, such source/drain features may be formed by one or more epitaxial processes. In some cases, the epitaxial source/drain features, disposed within the source/drain regions 312, may be formed in, on, and/or surrounding the fin 302. In various examples, a silicide layer may be formed over the epitaxial source/drain features, for example, to reduce contact resistance. In some cases, the device 300 further includes an ILD layer 318 disposed over the epitaxial source/drain features in the source/drain regions 312, interposing adjacent gate structures. By way of example, the ILD layer 318 may include an oxide layer, a low-K dielectric layer, or other appropriate dielectric layer. In some embodiments, a liner layer may be formed interposing the spacer layers 308, 310 and the ILD layer 318, and interposing the epitaxial source/drain features and the ILD layer 318. In some examples, such a liner layer, if present, may be formed prior to forming the ILD layer 318 and may include a SiN layer. In some cases, the device 300 also includes a hard mask layer 319 disposed over the ILD layer 318. In some embodiments, the hard mask layer 319 may include a silicon nitride layer such as $Si_3N_4$, silicon oxynitride, silicon carbide, and/or a pad oxide layer such as $SiO_2$.

Figure 4:
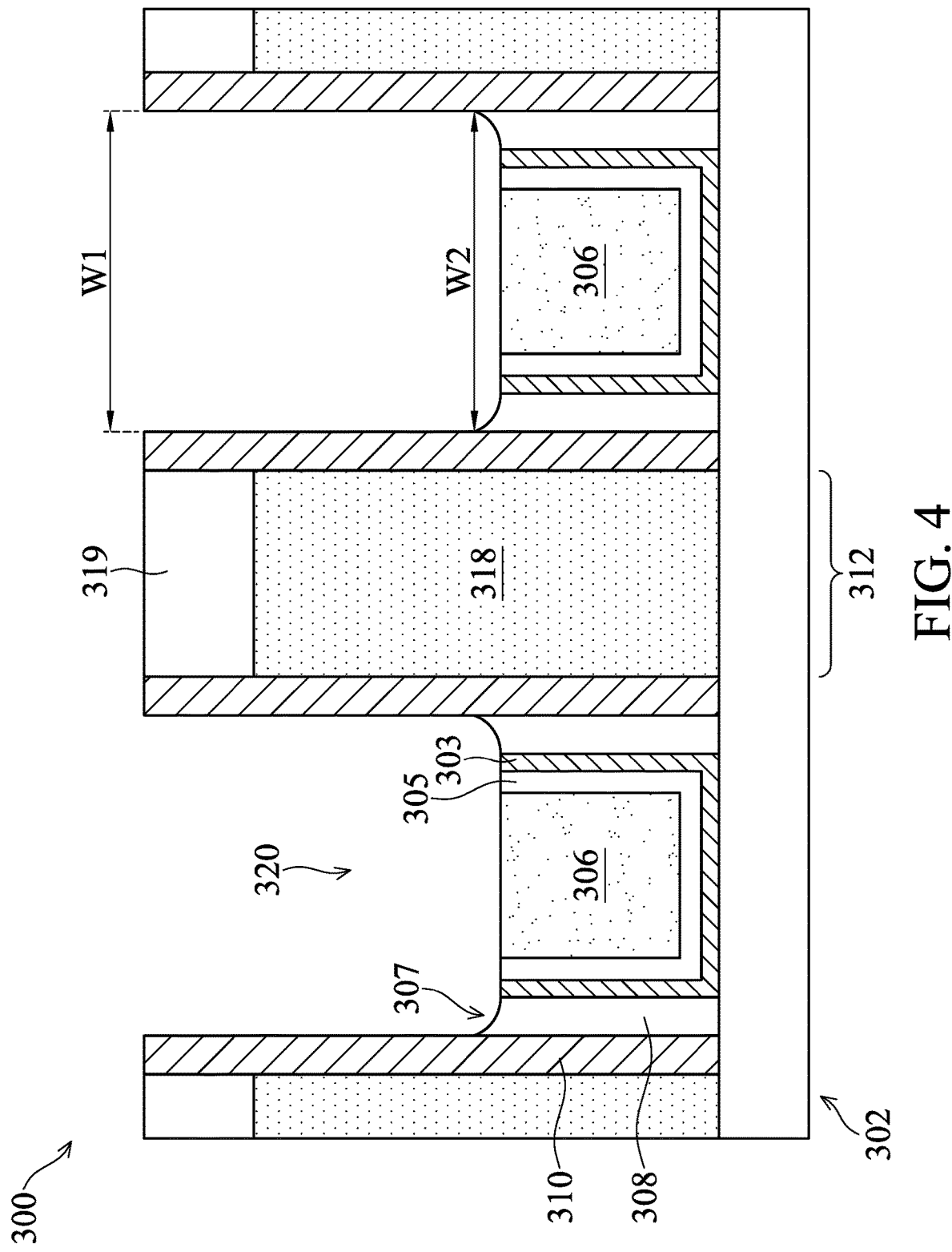

The method 200 then proceeds to block 204 where a metal gate etch-back process is performed. Referring to the example of FIGS. 3 and 4, in an embodiment of block 204, a metal gate etch-back process is performed to etch-back the metal layer 306 and the gate dielectric layer including the interfacial layer 303 and the high-K dielectric layer 305. The metal gate etch-back process may include a wet etch, a dry etch, or a combination thereof. It is also noted that the metal gate etch-back process of block 204 forms an opening 320 over the gate stack, as shown in FIG. 4. In some embodiments, the metal gate etch-back process may also at least partially etch the sidewall spacer layer 308 such that the at least partially etched sidewall spacer layer 308 has a curved (or non-planar) surface 307. In various cases, the metal gate etch-back process may also leave the sidewall spacer layer 310 substantially unetched. Moreover, after the metal gate etch-back process, a width 'W1' of the opening 320 in a top region of the opening 320 may be substantially the same as a width 'W2' of the opening 320 in a bottom region of the opening 320. In some embodiments, the width 'W1' and the width 'W2' may be equal to about 21 nm (+/−3 nm).

The method 200 then proceeds to block 206 where a plasma treatment process is performed. Referring to the example of FIGS. 4 and 5, in an embodiment of block 206, a plasma treatment process (also referred to herein as a dry etching process) is performed to modify a profile of the opening 320 within which a SAC HM layer will subsequently be formed. In some examples, the plasma treatment process includes a fluorine plasma treatment. In at least one example, a fluorine plasma treatment may be performed using a sulfur hexafluoride ($SF_6$) gas. The plasma treatment process, in some cases, may be performed for a time of between about 5-15 seconds, at a temperature of between about 70-100 degrees Celsius, and using a plasma source power of between about 150-500 Watts. In various embodiments, and as an alternative to $SF_6$ gas, the plasma treatment process may be performed with a different fluorine-containing gas. For instance, in some embodiments, the plasma treatment process may be performed using nitrogen trifluoride ($NF_3$), carbon tetrafluoride ($CF_4$), other carbon- and fluorine-containing gases (e.g., $C_xF_y$), as well as other fluorine-containing gases.

Figure 5:
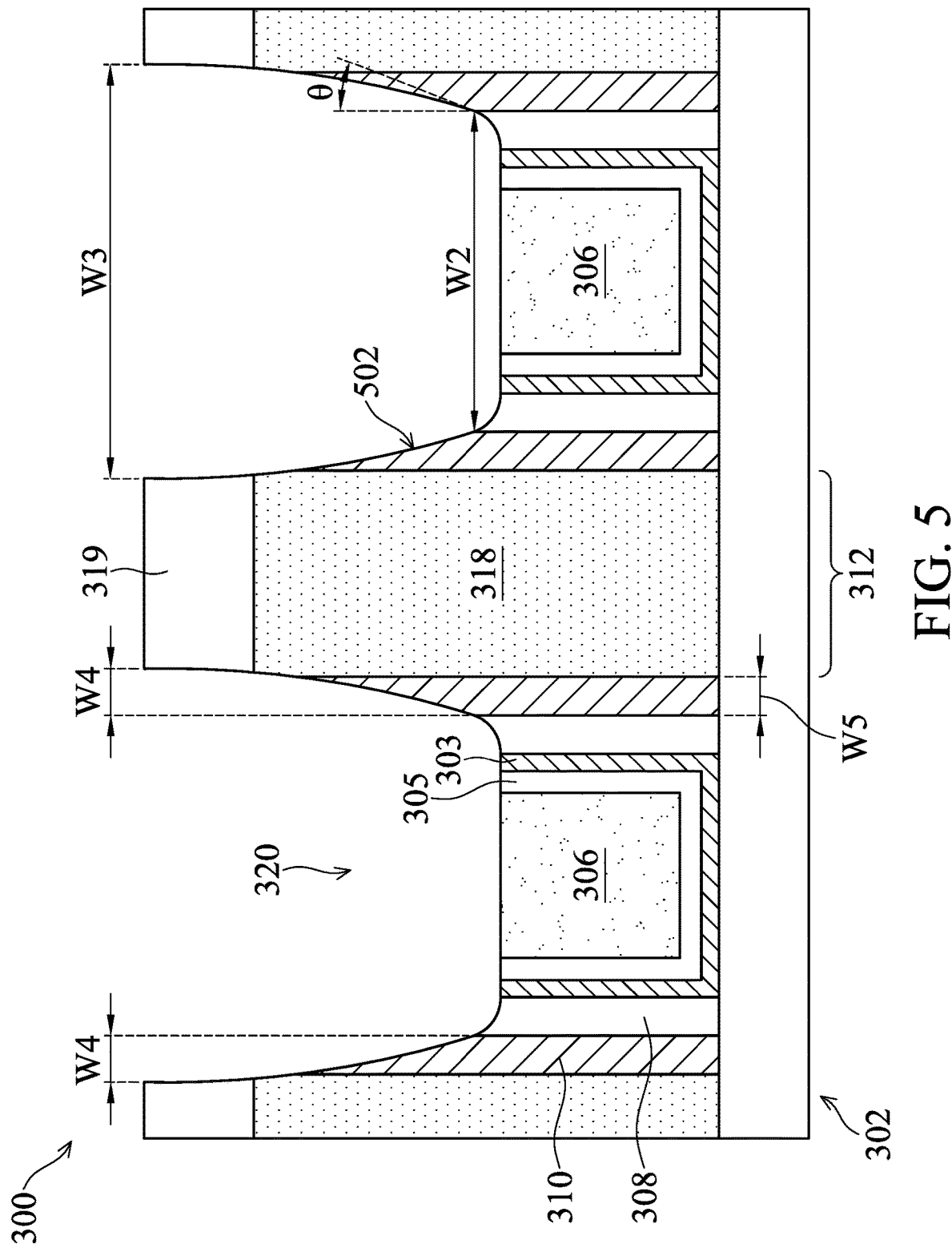
Figure 6:
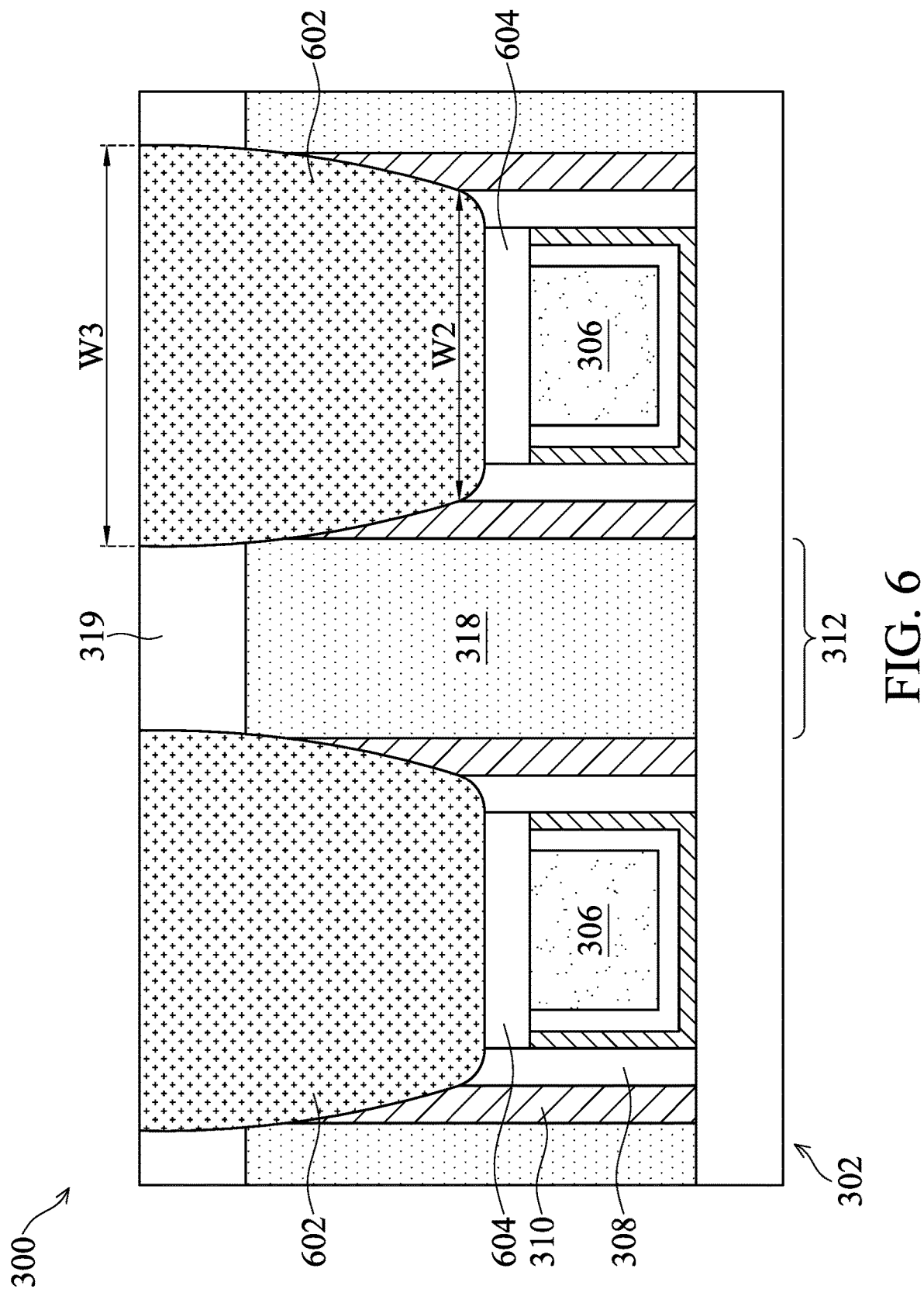

In some embodiments, the plasma treatment process serves to increase the width of the opening 320 across a substantial portion of the opening 320 from top to bottom, but especially within the top region of the opening 320. In some examples, after the plasma treatment process, a width 'W3' of the opening 320 in the top region of the opening 320 is greater than the width 'W2' of the opening 320 in the bottom region of the opening 320. In some embodiments, the width 'W3' may be equal to about 27 nm (+/−3 nm), and the width 'W2' may be equal to about 21 nm (+/−3 nm), as previously noted. As shown in FIG. 5, the plasma treatment process may also form tapered sidewalls 502 within the opening 320, such that the width 'W3' at the top region of the opening 320 gradually decreases to the width 'W2' at the bottom region of the opening 320. In some embodiments, the tapered sidewalls 502 may include curved (non-planar) tapered surfaces or planar tapered surfaces. By way of example, the increase in the width of the opening 320 by the plasma treatment process is provided by removal of sidewall portions of the opening 320 having widths 'W4'. The width 'W4' of the removed sidewall portions corresponds to (or provides) the tapered sidewalls 502, thus the width 'W4' decreases from top to bottom of the opening 320. It is also noted that the width 'W4' (at the top of the opening 320) is equal to a difference between the width 'W3' (at the top of the opening 320) and the width 'W2' (at the bottom of the opening 320), where such difference is equal to about 6 nm (+/−3 nm). In some embodiments, the increase in the width of the opening 320 provided by the plasma treatment process, as described above, may be accomplished by removal of a tapered top portion of the sidewall spacer layer 310. In some embodiments, the width 'W4' (at the top of the opening 320) is equal to a width 'W5' of the sidewall spacer layer 310. However, in some cases, the width 'W4' (at the top of the opening 320) may be greater than the width 'W5', for example, in cases where the plasma treatment process also removes portions of the hard mask layer 319 and/or the ILD layer 318.

In some embodiments, the tapered sidewalls 502 of the opening 320 may at least be partially defined by an angle 'θ', measured between a vertical plane including a sidewall surface of the sidewall spacer layer 310 (the sidewall surface in contact with the sidewall spacer layer 308) and a plane tangent to the tapered sidewall 502, as shown in FIG. 5. In some embodiments, the angle 'θ' may be in a range of between about 10-45 degrees. In some examples, the angle 'θ' may be equivalently referred to as a "curve angle". In some cases, the enlarged opening 320 provided by the plasma treatment process may be referred to as a U-shaped opening with non-parallel (or diverging) sides. As a result of the plasma treatment process, the subsequently formed SAC HM layer, described below, will have a larger width in the top region of the opening 320 as compared to the bottom region of the opening 320, improving device reliability and performance.

Figure 8:
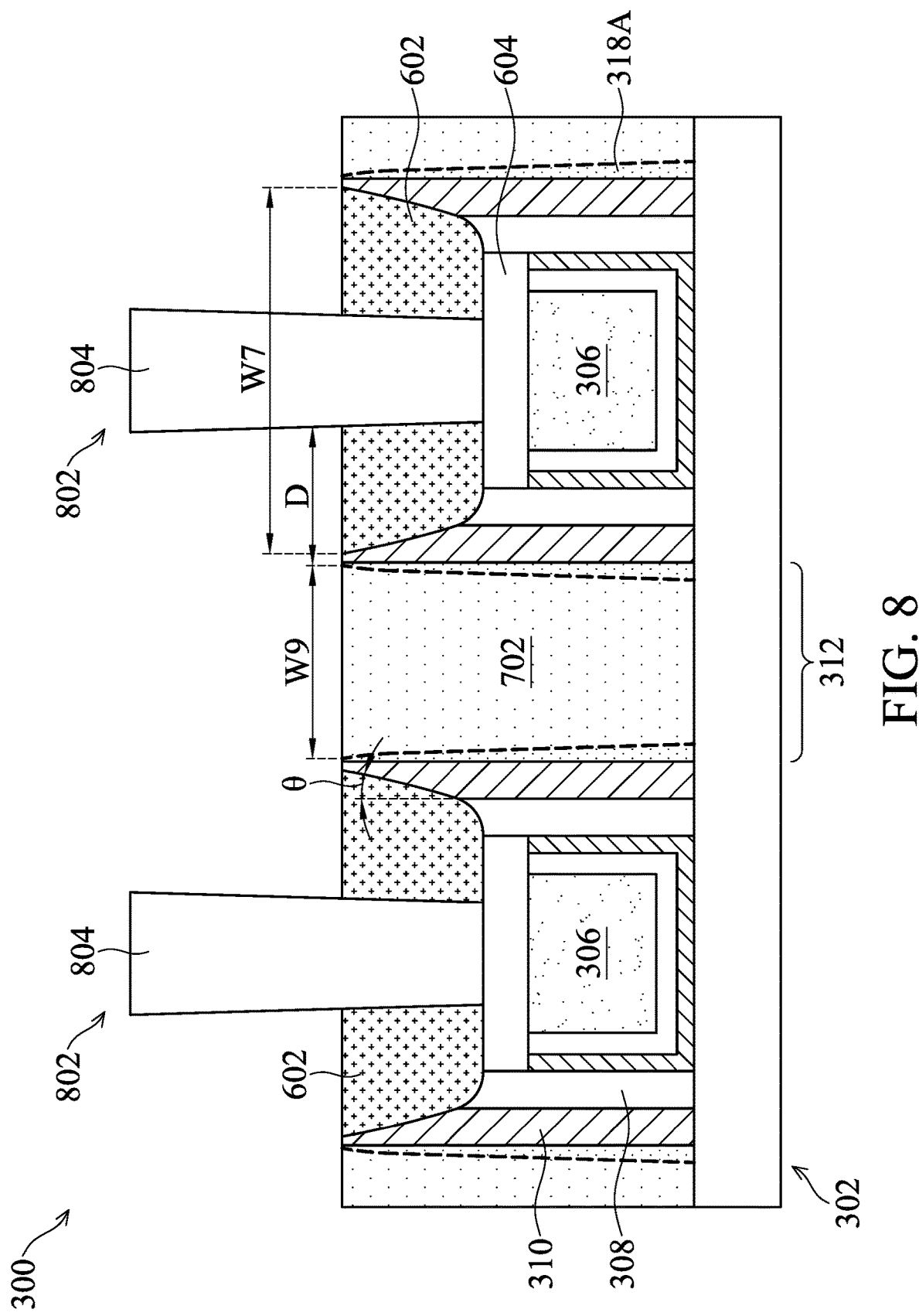
Figure 9:
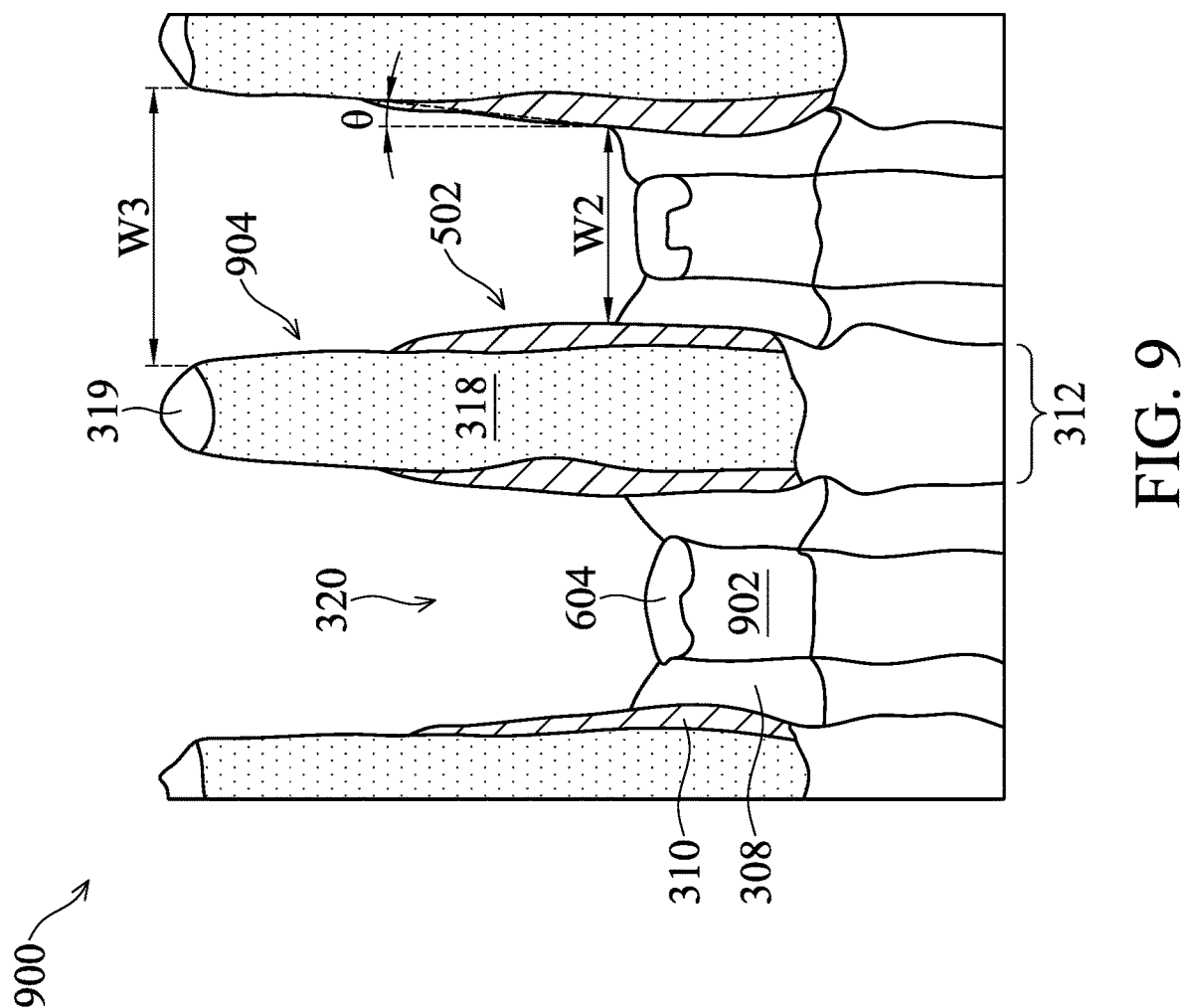
FIG. 9 illustrates a contour image of an exemplary real, as-fabricated device that generally corresponds to the device of FIG. 5, in accordance with some embodiments.

By way of example, and with reference to FIG. 9, illustrated therein is a contour image 900 of a real, as-fabricated device that generally corresponds to the device 300 of FIG. 5. While not necessarily including every feature shown in FIG. 5, the contour image 900 provides contours of various salient features of the device 300 after the plasma treatment process of block 206 and after subsequent deposition of a glue layer 604 (at block 208). For instance, the contour image 900 illustrates the spacer layers 308, 310, the source/drain region 312, the ILD layer 318, the hard mask layer 319, a gate structure 902 (including the interfacial layer 303, the high-K dielectric layer 305, and the metal layer 306), the opening 320 having the tapered sidewalls 502, and the glue layer 604. Additionally, the contour image 900 illustrates the width 'W2' of the opening 320 in the bottom region of the opening 320, the width 'W3' of the opening 320 in the top region of the opening 320, and the angle 'θ', each of which has been previously discussed. The contour image 900 also underscores the fact that real, as-fabricated devices include features that may generally have different shapes (e.g., including irregular shapes and/or shapes having non-linear surfaces or planes) than those provided in FIGS. 3-8, referred to in the discussion of the method 200. As one example, the hard mask layer 319 is shown as having a substantially rectangular shape in FIG. 5, while the contour image 900 illustrates the hard mask layer 319 as having an irregular shape. In another example, the ILD layer 318 is shown as having substantially vertical sidewalls in FIG. 5, while the contour image 900 illustrates the ILD layer 318 as having tapered sidewalls 904. As one additional example, the glue layer 604 is shown as having a substantially rectangular shape in FIG. 6, while the contour image 900 illustrates the glue layer 604 as having an irregular shape. Thus, the shapes and arrangements of the various features shown and described herein are, of course, merely examples and are not intended to be limiting.

The method 200 then proceeds to block 208 where a SAC HM layer is formed. Referring to the example of FIGS. 5 and 6, in an embodiment of block 208, a SAC HM layer 602 is formed within the enlarged opening 320 provided by the plasma treatment process of block 206. In some embodiments, prior to forming the SAC HM layer 602, a glue layer 604 is formed within the enlarged opening 320, over the etched-back metal layer 306 and the gate dielectric layer including the interfacial layer 303 and the high-K dielectric layer 305. In some cases, the glue layer 604 includes tungsten (W) or a tungsten-containing compound, although other suitable metals may also be used. In at least some examples, the glue layer 604 includes a fluorine-free W (FFW) layer. In various embodiments, the glue layer 604 may be deposited using CVD, ALD, PVD, or other suitable method. After formation of the glue layer 604, the SAC HM layer 602 is deposited over the glue layer 604, over the at least partially etched sidewall spacer layer 308, and over a remaining tapered lower portion of the sidewall spacer layer 310 having the tapered sidewalls 502, where the SAC HM layer 602 substantially fills the enlarged opening 320. The SAC HM layer 602 may be described, in some embodiments, as a U-shaped hard mask layer with non-parallel (or diverging) sides. In some examples, a width of the SAC HM layer 602 at the top region of the opening 320 may be substantially equal to the width 'W3', described above. In some embodiments, the SAC HM layer 602 includes a nitrogen-containing layer such as a SiN layer. In some embodiments, the SAC HM layer 602 may include an amorphous silicon (a-Si) layer. In various examples, the SAC HM layer 602 may be deposited by ALD, CVD, PVD, or by another suitable method. In various embodiments, the SAC HM layer 602 may alternatively include a dielectric material such as silicon oxide, silicon oxynitride, SiC, SiCN, SiOC, SiOCN, a low-K dielectric material, or a combination thereof. In some cases, after formation of the glue layer 604 and prior to deposition of the SAC HM layer 602, a liner layer may be conformally deposited within the enlarged 320, for example, over the glue layer 604 and on sidewalls of the opening 320. In some embodiments, the liner layer, if present, may include a high-K material layer such as $HfO_2$, $ZrO_2$, $Al_2O_3$, or other appropriate high-K material, where the high-K material layer may be deposited by CVD, ALD, or other appropriate method.

The method 200 then proceeds to block 210 where a CMP process is performed. Referring to the example of FIGS. 6 and 7, in an embodiment of block 210 and after formation of the SAC HM layer 602, a CMP process is performed to remove excess material and to planarize a top surface of the device 300. In particular, and in an embodiment of block 210, the CMP process serves to remove the hard mask layer 319 and to expose the underlying ILD layer 318. In some embodiments, the CMP process also thins the SAC HM layer 602 by removing a top portion of the SAC HM layer 602. In some case, a thickness of the SAC HM layer 602 that is removed by the CMP process is substantially equal to a thickness of the hard mask layer 319.

The method 200 then proceeds to block 212 where source/drain contacts are formed. Still referring to the example of FIGS. 6 and 7, in an embodiment of block 212 and following the CMP process of block 210, an etching process is used to remove the ILD layer 318 (exposed by the CMP process of block 210) from over the source/drain regions 312 to form contact openings that expose the epitaxial source/drain features within the source/drain regions 312. In various embodiments, the contact openings may be etched using a dry etch, a wet etch, or a combination thereof. In some cases, a residual layer 318A of the ILD layer 318 may remain on sidewalls of the sidewall spacer layer 310 after formation of the contact openings. In some embodiments, and during the etching process to form the contact openings, the SAC HM layer 602 protects the gate stack, the glue layer 604, and the remaining portions of the sidewall spacer layers 308, 310 of the device 300. Stated another way, and because of the SAC HM layer 602, the contact opening that exposes the epitaxial source/drain features can be directly etched without the use of photolithography (e.g., a self-aligned process). In some cases, and due to the etching process used to form the contact openings, opposing top edges of the SAC HM layer 602 may be at least partially etched to form rounded corners 705. As a result, a topmost width of the SAC HM layer 602 may be equal to a width 'W6', where the width 'W6' is less than the width 'W3' and greater than the width 'W2'. Further, and again due to the formation of the rounded corners 705, a width 'W7' may be defined a distance below the top surface of the SAC HM layer 602, where the width 'W7' is greater than the topmost width of the SAC HM layer 602 'W6'.

Figure 7:
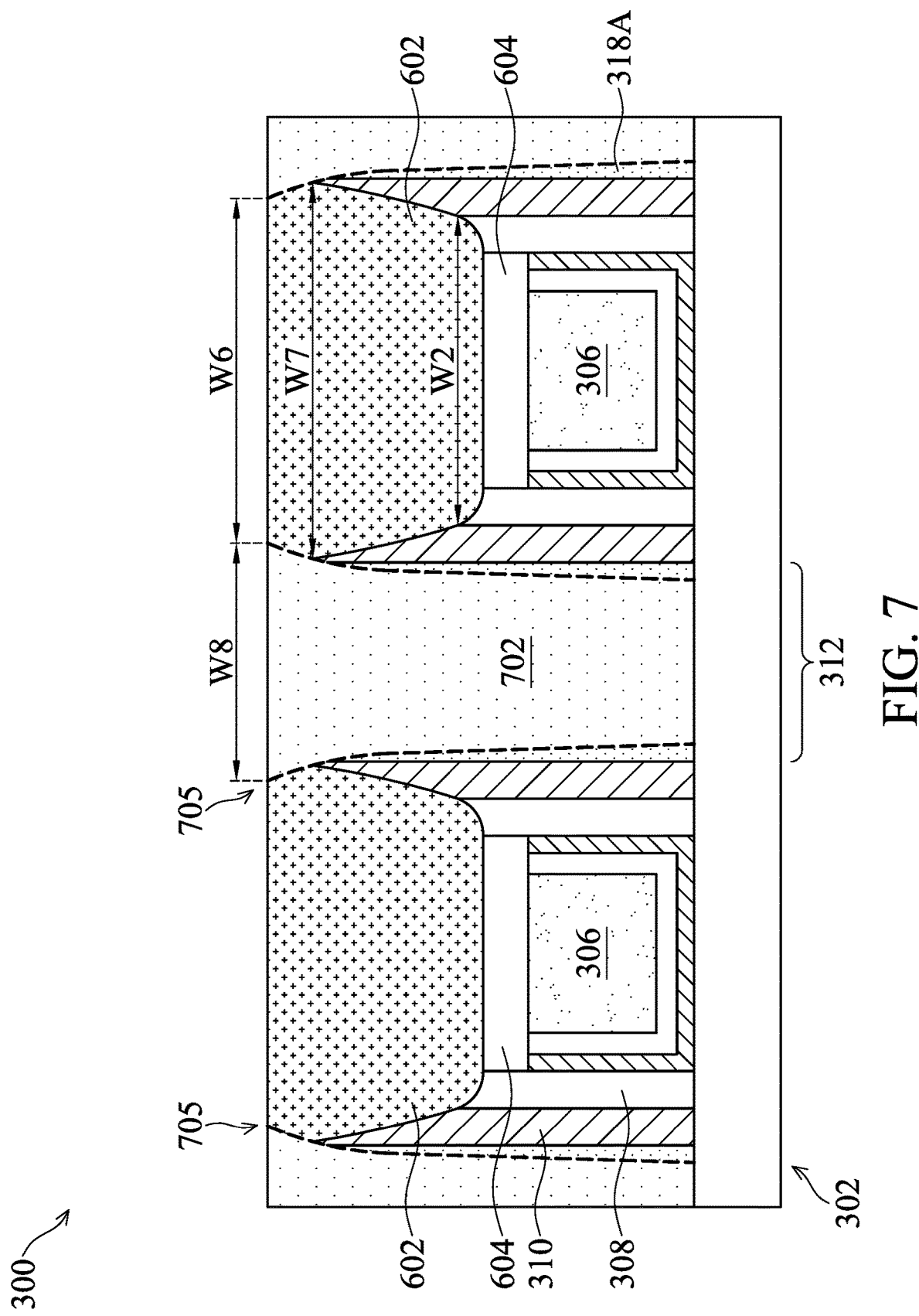

In a further embodiment of block 212, a contact metal is deposited, and a CMP process is performed. As shown in FIG. 7, a metal layer 702 is deposited over the device 300 and within the contact openings over the exposed epitaxial source/drain features in the source/drain regions 312, such that metal layer 702 provides an electrical connection to the epitaxial source/drain features. In some embodiments, a pre-clean (e.g., to remove native oxides and/or other contaminants) and silicide formation (e.g., such as TiSi) may be performed over the exposed epitaxial source/drain features just prior to the deposition of the metal layer 702. In at least some examples, the metal layer 702 includes a Co layer, although other suitable metals may be used without departing from the scope of the present disclosure (e.g., such as W). In some cases, the metal layer 702 may be deposited by PVD, e-beam evaporation, CVD, ALD, or other appropriate method. In some embodiments, and due at least in part to the formation of the rounded corners 705, a topmost width of the metal layer 702 may be equal to a width 'W8'. After forming the metal layer 702, and in a further embodiment of block 212, a CMP process is performed. For example, with reference to FIGS. 7 and 8, a CMP process may be performed to remove portions of the metal layer 702 and to planarize a top surface of the device 300. In addition, in some embodiments, the CMP process may be used to remove a top portion of the SAC HM layer 602, to further thin the SAC HM layer 602. In some cases, the CMP process proceeds until reaching the residual layer 318A and/or the sidewall spacer layer 310, and the CMP process may in some cases remove at least some of the residual layer 318A and/or the sidewall spacer layer 310. In various embodiments, the CMP process also serves to remove the rounded corners 705. As a result of the CMP process, the new topmost width of the SAC HM layer 602 may be substantially equal to the width 'W7', greater than that prior topmost width 'W6' and greater than the width 'W2'. Moreover, in some embodiments and due to the CMP process, the new topmost width of the metal layer 702 may be equal to a width 'W9', which is less than the prior topmost width 'W8'.

The method 200 then proceeds to block 214 where metal gate vias are formed. Still referring to the example of FIG. 8, in an embodiment of block 214 and following formation of the source/drain contacts (block 212), metal gate vias 802 are formed. By way of example, gate via openings are initially formed, within which the metal gate vias 802 will subsequently be formed. In some embodiments, the gate via openings expose, and thus provides access to, the glue layer 604. In at least some cases, the device 300 may not include the glue layer 604, and the gate via openings may thus directly expose the metal layer 306 of the gate stack. In some cases, the gate via openings may be formed by a suitable combination of lithographic patterning and etching (e.g., wet or dry etching of the SAC HM layer 602) processes. In various embodiments, the gate via openings are substantially aligned (e.g., centered) with the gate stacks of the device 300. After formation of the gate via openings, a metal layer 804 is formed over the glue layer 604 and within the gate via openings to define the metal gate vias 802. In some examples, the metal layer 804 may include W, Cu, Co, Ru, Al, Rh, Mo, Ta, Ti, or other conductive material. In various cases, the metal layer 804 may include a bulk filled metal layer, an ALD deposited metal layer, or a selective bottom-up metal fill layer. After formation of the metal gate vias 802, a CMP process may be performed to remove excess material and planarize the top surface of the device 300.

As shown in FIG. 8, a distance 'D' is defined between the metal layer 804 (gate via 802) and the metal layer 702 (source/drain contact metal). The distance 'D' may include a width of a portion of the SAC HM layer 602 on one side of the metal layer 804, as well as widths of any portions of the residual layer 318A and/or the sidewall spacer layer 310 that were exposed during the CMP process, as discussed above. In particular, and because of the modified profile of the SAC HM layer 602 and the more precise profile/landing accuracy of the source/drain contact metal, the distance 'D' provides a safe distance (e.g., provides a sufficient process window) to avoid an electrical short between the metal gate via 802 (the metal layer 804) and the source/drain contact metal (the metal layer 702). As a result, and in accordance with the various embodiments disclosed herein, reliability and performance of the device 300 is enhanced.

It is also noted that, in some embodiments, and because SAC HM layer 602 is formed over the tapered sidewalls 502 of the opening 320, the SAC HM layer 602 may also be at least partially defined by the angle 'θ' (e.g., the curve angle), measured between a vertical plane including a sidewall surface of the sidewall spacer layer 310 (the sidewall surface in contact with the sidewall spacer layer 308) and a plane tangent to a sidewall surface of the SAC HM layer 602 (also tangent to the tapered sidewall 502), as shown in FIG. 8. In some embodiments, the angle 'θ' may be in a range of between about 10-45 degrees.

Figure 10:
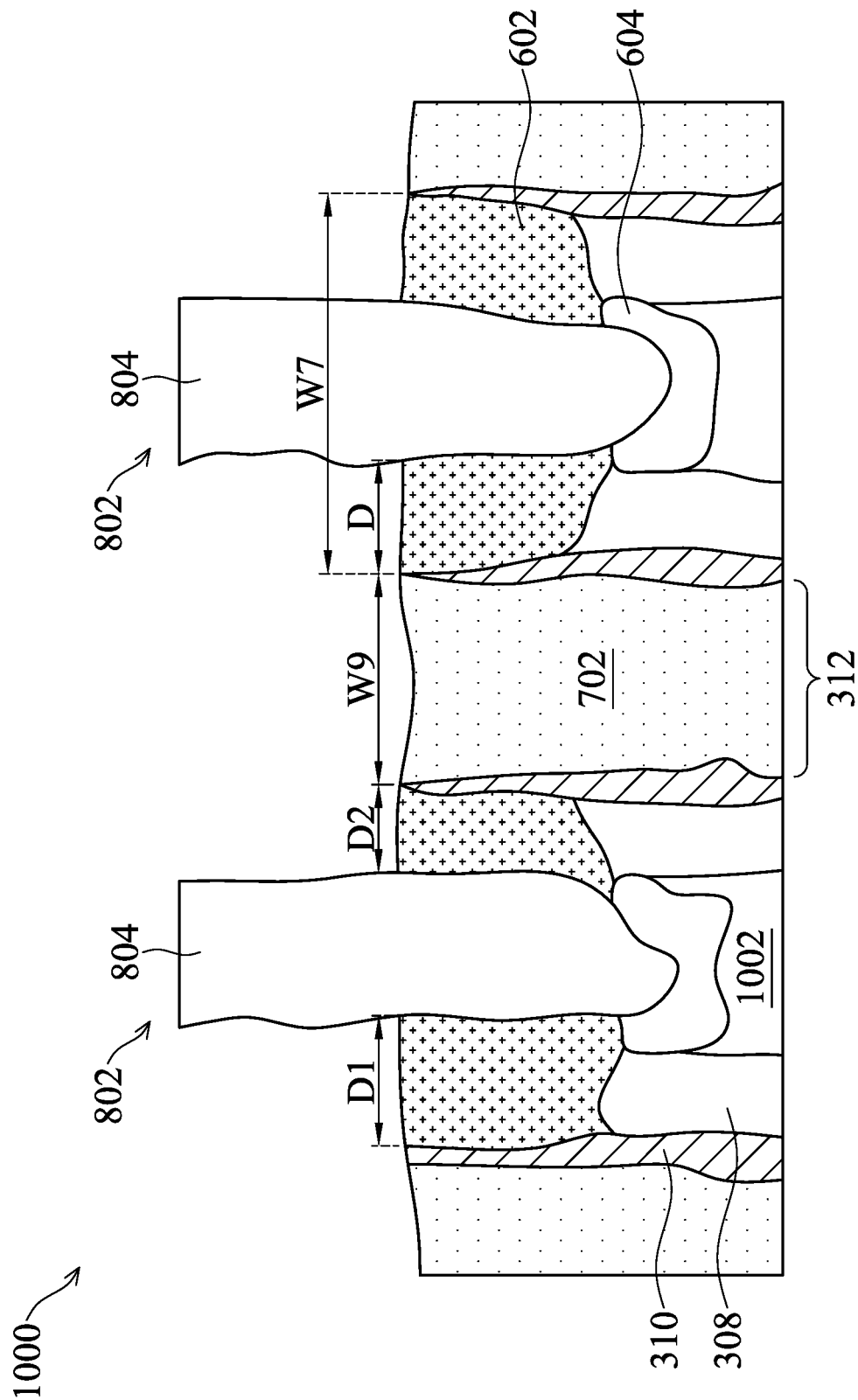
FIG. 10 illustrates a contour image of an exemplary real, as-fabricated device that generally corresponds to the device of FIG. 8, in accordance with some embodiments.

By way of example, and with reference to FIG. 10, illustrated therein is a contour image 1000 of a real, as-fabricated device that generally corresponds to the device 300 of FIG. 8. While not necessarily including every feature shown in FIG. 8, the contour image 1000 provides contours of various salient features of the device 300 after the formation of the metal gate vias (at block 214). For instance, the contour image 1000 illustrates the spacer layers 308, 310, the source/drain region 312, the metal layer 702 (source/drain contact metal), a gate structure 1002 (including the interfacial layer 303, the high-K dielectric layer 305, and the metal layer 306), the glue layer 604, the SAC HM layer 602, and the metal gate vias 802 including the metal layer 804. Additionally, the contour image 1000 illustrates the width 'W7', the width 'W9', and the distance 'D', each of which has been previously discussed. The contour image 1000 also underscores the fact that real, as-fabricated devices include features that may generally have different shapes (e.g., including irregular shapes and/or shapes having non-linear surfaces or planes) than those provided in FIGS. 3-8, referred to in the discussion of the method 200. As one example, the metal layer 804 is shown as having substantially straight/linear edges in FIG. 8, while the contour image 1000 illustrates the metal layer 804 as having an irregular/non-linear edges. In another example, the glue layer 604 is shown as having a substantially rectangular shape in FIG. 8, while the contour image 1000 illustrates the glue layer 604 as having an irregular shape. As one additional example, the distance 'D' is shown as being substantially equal on opposing sides of the metal layer 804 in FIG. 8, while the contour image 1000 illustrates that this distance may not necessarily be the same on opposing sides of the metal layer 804 (e.g., compare 'D1' to 'D2' shown on left metal gate via 802). Thus, the shapes and arrangements of the various features shown and described herein are, of course, merely examples and are not intended to be limiting.

The device 300 may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for modifying the SAC HM layer profile to provide precise landing of the source/drain contact metal on the source/drain region of the transistor while also preventing shorting to the metal gate via, thereby enhancing device performance. In some examples, and after a metal gate etch-back process, a fluorine-based plasma treatment may be performed to modify the profile of an opening over the transistor gate within which the SAC HM layer will be formed. As a result of the plasma treatment process, the subsequently formed SAC HM layer will have a larger width in a top region of the SAC HM layer and a smaller width in a bottom region of the SAC HM layer. By providing the modified SAC HM layer profile, the etching window for the source/drain contact metal may be improved, which provides for the precise landing of the source/drain contact metal on the source/drain region of the transistor and an improved/more precise profile of the source/drain contact metal, while any possible shorting between the metal gate via and the source/drain contact metal can be prevented, thus enhancing device performance. Additional embodiments and advantages will be evident to those skilled in the art in possession of this disclosure.

Thus, one of the embodiments of the present disclosure described a method including providing a device having a gate stack with a metal gate layer and a spacer layer disposed on a sidewall of the gate stack. In some embodiments, the method further includes performing an etch-back process to the metal gate layer to form an opening over the gate stack. In various examples, the method further includes performing a plasma treatment process to modify a profile of the opening. In some cases, the method further includes forming a HM layer over the metal gate layer and within the opening having the modified profile.

In another of the embodiments, discussed is a method where a device including a gate stack having an etched-back metal gate layer, a first spacer layer disposed on a sidewall of the gate stack along a first surface of the first spacer layer, and a second spacer layer disposed along a second surface of the first spacer layer opposite the first surface is provided. In some embodiments, the first spacer layer is at least partially etched-back, and the etched-back metal gate layer, the at least partially etched-back first spacer layer, and the second spacer layer collectively define an opening. In some embodiments, the method further includes performing a plasma treatment process using a fluorine-containing gas to enlarge the opening by removing a first portion of the second spacer layer. In some examples, the method further includes depositing a nitrogen-containing layer within the enlarged opening and over the etched-back metal gate layer, over the at least partially etched-back first spacer layer, and over a second portion of the second spacer layer that remains after the plasma treatment process.

In yet another of the embodiments, discussed is a semiconductor device including a gate stack having a metal gate layer. In some embodiments, the semiconductor device further includes sidewall spacers disposed on opposing sidewalls of the gate stack. In some cases, the semiconductor device further includes a U-shaped hard mask layer disposed over the sidewall spacers and over the gate stack. In some examples, a first width of a top portion of the U-shaped hard mask layer is greater than a second width of a bottom portion of the U-shaped hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a device including a gate stack having a metal gate layer and a spacer layer disposed on a sidewall of the gate stack;
performing an etch-back process to the metal gate layer to form an opening over the gate stack, wherein the etch-back process forms a curved surface along a first portion of the spacer layer;
performing a plasma treatment process to modify a profile of the opening by removing a second portion of the spacer layer; and
forming a hard mask (HM) layer over the metal gate layer and within the opening having the modified profile.

2. The method of claim 1, wherein the plasma treatment process includes a fluorine plasma treatment process.

3. The method of claim 1, wherein the plasma treatment process is performed using a sulfur hexafluoride ($SF_6$) gas.

4. The method of claim 1, wherein the modifying the profile of the opening includes increasing a width of the opening.

5. The method of claim 1, wherein a first width in a top region of the opening having the modified profile is greater than a second width in a bottom region of the opening having the modified profile.

6. The method of claim 1, wherein the opening having the modified profile includes tapered sidewalls.

7. The method of claim 1, wherein the plasma treatment process modifies the profile of the opening by removing the second portion of the spacer layer disposed on the sidewall of the gate stack.

8. The method of claim 1, wherein the opening having the modified profile includes a U-shaped opening with diverging sides.

9. The method of claim 1, further comprising:
after forming the HM layer, performing a self-aligned etching process to expose a source/drain feature adjacent to the gate stack; and
depositing a contact metal layer over the exposed source/drain feature to provide an electrical connection to the source/drain feature.

10. The method of claim 9, further comprising:
after depositing the contact metal layer, forming a gate via opening within the HM layer to expose the metal gate layer; and
forming a metal layer within the gate via opening to provide a metal gate via.

11. A method, comprising:
providing a device including a gate stack having an etched-back metal gate layer, a first spacer layer disposed on a sidewall of the gate stack along a first surface of the first spacer layer, and a second spacer layer disposed along a second surface of the first spacer layer opposite the first surface, wherein the first spacer layer is at least partially etched-back and has a curved surface, and wherein the etched-back metal gate layer, the at least partially etched-back first spacer layer with the curved surface, and the second spacer layer collectively define an opening;
performing a plasma treatment process using a fluorine-containing gas to enlarge the opening by removing a first portion of the second spacer layer; and
depositing a hard mask layer within the enlarged opening and over the etched-back metal gate layer, over the at least partially etched-back first spacer layer, and over a second portion of the second spacer layer that remains after the plasma treatment process.

12. The method of claim 11, wherein the fluorine-containing gas includes sulfur hexafluoride ($SF_6$), nitrogen trifluoride ($NF_3$), or carbon tetrafluoride ($CF_4$).

13. The method of claim 11, wherein a first width of the hard mask layer formed in a top region of the enlarged opening is greater than a second width of the hard mask layer formed in a bottom region of the enlarged opening.

14. The method of claim 11, wherein a first width of the first portion of the second spacer layer that is removed from a top region of the opening by the plasma treatment process is substantially equal to a second width of the second portion of the second spacer layer along a bottom region of the opening.

15. The method of claim 11, further comprising:
after depositing the hard mask layer, etching an ILD layer adjacent to the gate stack to expose a source/drain feature, wherein the etching the ILD layer partially etches opposing top edges of the hard mask layer to form rounded corners; and
depositing a contact metal layer over the exposed source/drain feature.

16. The method of claim 15, further comprising:
after depositing the contact metal layer, performing a CMP process to remove a first top portion of the contact metal layer and a second top portion of the hard mask layer including the rounded corners;
wherein the CMP process increases a first topmost width of the hard mask layer, and wherein the CMP process decreases a second topmost width of the contact metal layer.

17. The method of claim 15, further comprising:
after depositing the contact metal layer, forming a gate via opening within the hard mask layer to expose the etched-back metal gate layer; and
forming a metal layer within the gate via opening to provide a metal gate via.

18. The method of claim 11, further comprising:
prior to depositing the hard mask layer, forming a glue layer within the enlarged opening and over the etched-back metal layer; and
depositing the hard mask layer within the enlarged opening and over the glue layer.

19. A semiconductor device, comprising:
a gate stack including a metal gate layer;
first sidewall spacers having first lateral surfaces disposed on opposing sidewalls of the gate stack and second sidewall spacers disposed on second lateral surfaces of the first sidewall spacers; and
a U-shaped hard mask layer disposed over the first and second sidewall spacers and over the gate stack;

wherein a first width of a top portion of the U-shaped hard mask layer is greater than a second width of a bottom portion of the U-shaped hard mask layer; and wherein the second sidewall spacers have a third width, and wherein a difference between the first width and the second width is equal to the third width.

20. The semiconductor device of claim 19, further comprising:

a source/drain contact adjacent to the gate stack; and a metal gate via that penetrates the U-shaped hard mask layer and contacts the metal gate layer;

wherein the U-shaped hard mask layer is at least partially defined by a curve angle 'θ' that is measured between a vertical plane including a first sidewall surface of one of the first and second sidewall spacers and a plane tangent to a second sidewall surface of the U-shaped hard mask layer.

* * * * *